(12) United States Patent
Li et al.

(10) Patent No.: US 7,639,021 B2
(45) Date of Patent: Dec. 29, 2009

(54) CIRCUIT AND METHOD FOR DETECTING A DIELECTRIC BREAKDOWN FAULT

(75) Inventors: Edward Li, Roselle, IL (US); Mark Gunderson, Salem, WI (US); Wen Li, Round Lake, IL (US)

(73) Assignee: Temic Automotive of North America, Inc., Deer Park, IL (US)

( * ) Notice: Subject to any disclaimer, the term of this patent is extended or adjusted under 35 U.S.C. 154(b) by 151 days.

(21) Appl. No.: 11/747,755

(22) Filed: May 11, 2007

(65) Prior Publication Data

US 2008/0278174 A1    Nov. 13, 2008

(51) Int. Cl.
G01R 31/14    (2006.01)
H02K 11/00    (2006.01)

(52) U.S. Cl. ............... 324/525; 324/511; 322/99
(58) Field of Classification Search ............ 324/525, 324/511; 322/99
See application file for complete search history.

(56) References Cited

U.S. PATENT DOCUMENTS

| 4,929,901 | A  | * | 5/1990 | Kimball et al. ........... 324/529 |
| 6,075,339 | A  | * | 6/2000 | Reipur et al. ............ 320/110 |
| 6,856,137 | B2 | * | 2/2005 | Roden et al. ............. 324/509 |
| 6,861,895 | B1 | * | 3/2005 | Liu et al. ............... 327/536 |
| 2002/0121902 | A1 | * | 9/2002 | Suzuki .................. 324/509 |

* cited by examiner

Primary Examiner—Timothy J Dole
Assistant Examiner—Farhana Hoque (57) ABSTRACT

An improved circuit and method for detecting dielectric breakdown and ground fault conditions is provided. The circuitry and method of the present invention include taking a continuous voltage reading of the high voltage battery and sampling the continuous voltage reading of the high voltage battery at a fixed time interval. The circuitry and method calculate a change in the continuous voltage reading of the high voltage battery over the change in time and repeatedly calculate an optimum fixed time interval and an optimum change in voltage over time. Storage of the optimum fixed time interval and optimum change in voltage over time provides for repeatedly comparing the optimum change in voltage over the fixed time interval to the constant voltage of the high voltage battery to calculate the resistance of the dielectric breakdown fault. The calculation of the resistance of the dielectric breakdown fault is carried out independently of the capacitance of the electric circuit. The circuit and method provide adjustment of the optimum fixed time interval to improve the speed of the comparison of the optimum change in voltage over time to the constant voltage of the high voltage battery to calculate the resistance of the dielectric breakdown fault.

33 Claims, 12 Drawing Sheets

$$VR1 := VR1_{ss} + VR1_t \cdot e^{\frac{-t}{T}} \quad \text{—— AC Equation}$$

AC Equation (from 3 data points) to calculate final value (VR1).

$$VR1_{ss\_3P} := VR1\_0 - \frac{\Delta VR1\_1^2}{\Delta VR1\_2 - \Delta VR1\_1} \quad \text{—— Equation 1}$$

DC loop equation to calculate R fault.

$$Rdbs\_fault := \left(\frac{V2}{\frac{VR1}{R1}}\right) - R1 - R2 \quad \text{—— Equation 2}$$

Fig. 7A

Using Three points defines exponential response

The exponential response curve with steady state value of Yss:

$$VR1 := VR1ss + VR1t \cdot e^{-\frac{t}{T}} \quad\quad VR1t \text{ is the transient value}$$

Assume three consecutive samples with constant rate of $T_s$ $$VR1\_0 := VR1ss + VR1t \cdot e^{-\frac{T_0}{T}}$$

$$VR1\_1 := VR1ss + VR1t \cdot e^{-\frac{T_0+T_s}{T}} \quad T0 \text{ is the first sample time.}$$
$$T \text{ is the system time constant.}$$

$$VR1\_2 := VR1ss + Yt \cdot e^{-\frac{T_0+2T_s}{T}}$$

Let $A = VR1t \cdot e^{-\frac{T_0}{T}}$ and $B = e^{-\frac{T_s}{T}}$ and
we get:

$$VR1\_0 := VR1ss + A$$
$$VR1\_1 := VR1ss + A \cdot B$$
$$VR1\_2 := VR1ss + A \cdot B^2$$

Let $\Delta VR1\_2 = VR1\_2 - VR1\_1$ and $\Delta VR1\_1 = VR1\_1 - VR1\_0$ and get $$A := VR1\_0 - VR1ss \quad (1)$$
$$\Delta VR1\_1 := A(B - 1) \quad (2)$$
$$\Delta VR1\_2 := A(B - 1) \cdot B \quad (3)$$

From (1) and (2) get $\quad B - 1 := \dfrac{\Delta VR1\_1}{VR1\_0 - VR1ss} \quad (4)$ From (2) and (3) get $\quad B := \dfrac{\Delta VR1\_2}{\Delta VR1\_1} \quad (5)$ (5) - 1 := (4) get $$VR1ss\_3P := VR10 - \dfrac{\Delta VR1\_1^2}{\Delta VR1\_2 - \Delta VR1\_1} \quad VR1\_0 \text{ is the first sample value}$$

Apparently if $\Delta VR1\_2 - \Delta VR1\_1 = 0$, the above equation doesn't give a meaningful result. $\Delta VR1\_2 - \Delta VR1\_1$ could affect accuracy the most, especially when its value is small.

Error with "Three Point" Algorithm

Three A/D samples. They shall be integer numbers.

$VR1\_0 := \text{round}(VR1_5)$ at 5ms $VR1\_1 := \text{round}(VR1_{15})$ at 15ms $VR1\_2 := \text{round}(VR1_{25})$ at 25ms $VR1\_0 = 3996$ $\quad VR1\_1 = 3811 \quad$ $VR1\_2 = 3643$ $\Delta VR1\_1 := VR1\_1 - VR1\_0 \quad\quad\quad \Delta VR1\_2 := VR1\_2 - VR1\_1$ $\Delta VR1\_1 = -185 \quad\quad \Delta VR1\_2 = -168$ $\dfrac{\Delta VR1\_2}{\Delta VR1\_1} = 0.908 \quad$ Smaller the value, higher the accuracy Use 3 points to calculate steady state value $VR1_{ss\_3p} := VR1\_0 - \dfrac{\Delta VR1\_1^2}{\Delta VR1\_2 - \Delta VR1\_1}$ $VR1_{ss\_3p} = 1983$ $E_{3p} := \dfrac{VR1SS - VR1_{ss\_3p}}{VR1SS}$ $E_{3p} = 0.032$

Summary of Example1

With 12bit A/D accuracy, if the total sample time for three points is about 20% of system time constant, or $\Delta VR1\_2/\Delta VR1\_1 < 0.9$, the accuracy with "3 Point" theory is about 2.6%. Longer the sample time, or the smaller $\Delta VR1\_2/\Delta VR1\_1$, the higher the accuracy

CIRCUIT AND METHOD FOR DETECTING A DIELECTRIC BREAKDOWN FAULT

FIELD OF THE INVENTION

The present invention relates to detecting dielectric breakdown faults, and more particularly to an improved circuit and method for detecting dielectric breakdown and ground fault conditions

BACKGROUND OF THE INVENTION

High voltage applications, particularly electrically powered and hybrid (conventional fossil fuel power in combination with electrical power) vehicles require relatively large capacity battery system to deliver a relatively large amount of power compared to a 12 volt automobile storage battery. Since power is directly proportional to battery voltage and system current, the high power delivery requirements which must be satisfied by such batteries mean that higher electrical voltages will be present in electric and hybrid vehicles than in conventionally powered vehicles. Such vehicles are becoming increasingly attractive alternatives to fossil fuel powered cars. However, because of the high voltage requirements of its traction battery an electric or hybrid electric vehicle (HEV) raises significant electrical safety concerns.

For example, unwanted electric current flow outside of the intended circuit path (i.e. dielectric breakdown faults, ground fault conditions and the like) may cause significant damage to electronic components within a system (such as an electric vehicle or hybrid electric vehicle propulsion system), thereby disabling or even destroying the electronic equipment. In addition, such ground fault conditions may result in an electric shock, which can have more serious safety consequences when the shock is caused by contact with a high voltage battery system, as compared to a conventional, relatively low voltage automotive storage battery system. To reduce the likelihood of such shock, many high voltage battery systems are not grounded to the frame of the machine or vehicle chassis.

Instead, high voltage battery systems have a closed loop return path, so that the negative power conductor of the system (i.e., the electrical current return path) is isolated from the frame or chassis of the machine, electric vehicle or HEV.

While such isolated systems may minimize the likelihood of a significant electric shock to a person in the event of a short circuit or low impedance connection (i.e. dielectric breakdown fault), certain electronic components typically in electrical communication with the positive and negative power conductors (bus lines or rails) that supply high voltage power are subject to damage resulting from extreme voltage or current swings occurring thereon.

Existing high voltage standards relating to ground fault detection, including Federal Motor Vehicle Safety Standard (FMVSS) 305, require a minimum response time for detection under constant monitoring of the isolation parameters in both DC and AC circuits. In addition, these standards require detection of an isolation fault within 100 milliseconds and report of any such fault within 50 milliseconds of detection. The minimum isolation resistance recommended by the SAE is 500 ohms per volt and it is commonly preferred to set this measurement to at least twice the SAE minimum or 1000 ohms per volt.

Typically previously known fault detection circuits typically use resistor/capacitor networks requiring multiple measurement circuits to provide detection of dielectric breakdown resistance. This configuration results in greater expense due to the multiple measurement circuits required and slower than desired detection times due to the time constant created by the resistor/capacitor network. In addition, these circuits must reach steady state to obtain an accurate measurement which is an undesirable operational limitation. Furthermore these known detection circuits must pulse or switch high voltage to the chassis during measurement causing additional noise to be created in addition to the dangers associated with such a high voltage pulse. Moreover, prior art systems are not capable of measuring the ground fault resistance in both DC and AC circuits which provides an advantage in circuit operation, reducing circuit construction costs and meeting the standards of ground fault detection noted above.

Figure 1:
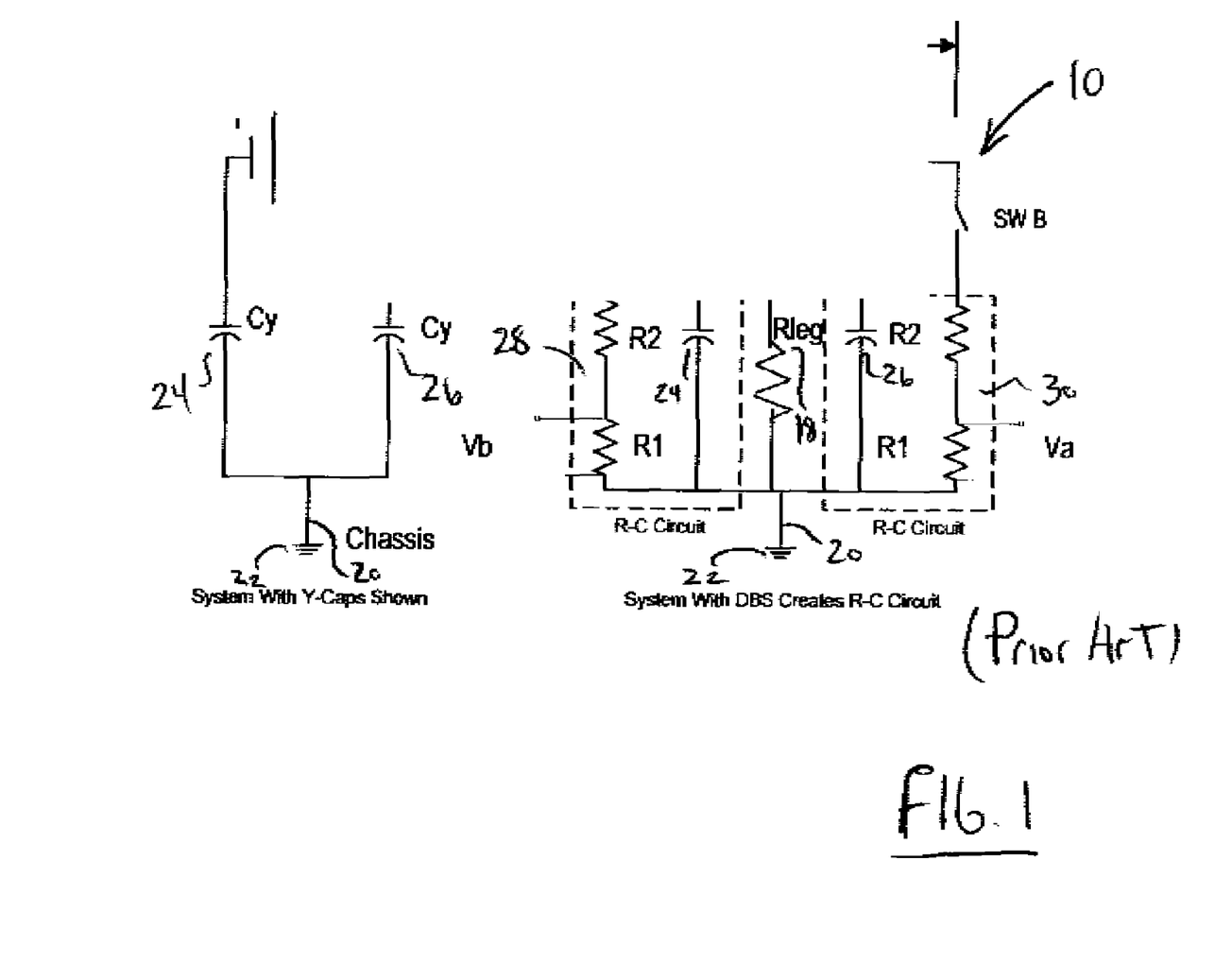
FIG. 1 is a schematic circuit diagram of a prior art fault detection circuit and the equation for calculating the resistance of the fault.

Such a prior art fault detection circuit is shown in FIG. 1 and is indicated generally by reference number 10. Prior art circuit 10 includes an isolated high voltage battery 12 with voltage V pack. As shown in FIG. 1, a leakage path is depicted by reference numeral 16 through resistance Rleg 18. Typically, battery 12 is grounded along with the line 20 to the vehicle chassis 22 through capacitors Cy 24, 26. As noted above, prior art system 10 must reach a steady state wherein no current is flowing through capacitors Cy 24, 26 to provide an accurate measurement of the dielectric breakdown resistance. To achieve this steady state condition, both R-C loops 28, 30 must be in a steady state condition before taking the Va and Vb readings necessary to calculate the dielectric breakdown resistance Rleg. Such a steady state requirement introduces less than desirable response time in detecting a dielectric breakdown fault. In addition, this prior art detection circuit must charge and discharge Vpack through the chassis of the vehicle which creates the potential for noise and electric shock through the chassis. Furthermore, this circuit varies and is dependent on the capacitance of the circuit which creates difficulty is accurately detecting and measuring the resistance of the dielectric breakdown fault. Importantly, this prior art circuit does not meet the detection time requirement of 100 ms as noted above in the Federal Motor Vehicle Safety Standard (FMVSS) 305 specification.

Accordingly, it is an object of the present invention to provide a system and method for detecting faults in high voltage battery systems which provide quick, accurate and cost effective fault detection in both DC and AC circuits, is safe and which does not unduly cause system battery drain. Another object of the present invention is to provide a system and method for detecting faults in high voltage, electric vehicle and hybrid vehicle battery systems which measures the dielectric breakdown system (DBS) resistance and detects the DBS fault to the chassis or frame when the DBS resistance is 35,000 ohms or less. Further, it is an object of the present invention to provide a system and method for detecting faults in high voltage, electric vehicle and hybrid vehicle battery circuits which detects the DBS fault to the chassis or frame and measures the dielectric breakdown system (DBS) resistance which is independent of the capacitance of the circuit. Still another object of the present invention is to provide a system for detecting faults in high voltage battery systems which is simple in construction, quick in detection response, does not introduce external current into the circuit to obtain a measurement, is easy to use and is cost effective.

SUMMARY OF THE INVENTION

The present invention discloses a detection circuit for detecting a dielectric breakdown fault in an electric circuit. The circuit includes a high voltage battery and circuitry for continuously monitoring the voltage of the high voltage battery. The voltage across the high voltage battery is sampled by taking a first voltage reading of the high voltage battery at a fixed time interval and subsequently sampled again by taking a second voltage reading of the high voltage battery at a fixed time interval. The change between the first and second voltage readings over the change in time is calculated and then compared to the voltage of the high voltage battery thereby generating a first output signal which is stored for later use and comparison. A third voltage reading of the high voltage battery is taken at a subsequent fixed time interval while the change between the second and third voltage readings over the change in time is calculated and compared to the voltage of the high voltage battery thereby generating a second output signal which is stored for later use and comparison to detect the dielectric breakdown fault and measure the resistance of such a fault. Circuitry is included for adjusting the sampling time interval to estimate the steady state voltage and using the output signals to determine the resistance of the dielectric breakdown fault.

The electric circuit may include capacitance but the detection circuit of the present invention detects a dielectric breakdown fault and measures the resistance of such a fault independent of any such capacitance included in the circuit. The detection circuit includes the ability to adjust the time interval by a minimum of a 10 percent variation in the change in voltage over the change in time. The detection circuit can be positioned near the center of the positive and negative terminals of the high voltage battery and can be switched into and out of the measuring circuit across the high voltage battery to conserve energy. The circuit measures the steady state DC voltage and resistance of the dielectric breakdown fault when the change in voltage over time of the circuit is below a predetermined threshold voltage or when the slope of the curve of the change in voltage over time approaches 0. The detection circuit also measures the value of the voltage reading of the high voltage battery to determine if the voltage is greater than or less than 0. In an aspect of the invention an amplifier is included in the detection circuit to amplify the signal which is representative of the value of the voltage reading of the high voltage battery when the signal is less than a threshold voltage. This threshold voltage level can be less than 1 volt but may be as low as 0.75 volts.

The detection circuit for detecting a dielectric breakdown fault in an electric circuit having a high voltage battery of the present invention includes circuitry which takes a continuous voltage reading of the high voltage battery and samples the continuous voltage reading of the high voltage battery at a fixed time interval. The circuitry calculates a change in the continuous voltage reading of the high voltage battery over the change in time and repeatedly calculates an optimum fixed time interval and an optimum change in voltage over time. Storage of the optimum fixed time interval and optimum change in voltage over time provides for repeatedly comparing the optimum change in voltage over the fixed time interval to the constant voltage of the high voltage battery to calculate the resistance of the dielectric breakdown fault. The calculation of the resistance of the dielectric breakdown fault is carried out independently of the capacitance of the electric circuit. The circuit provides adjustment of the optimum fixed time interval to improve the speed of the comparison of the optimum change in voltage over time to the constant voltage of the high voltage battery to calculate the resistance of the dielectric breakdown fault.

The detection circuit of the present invention embodies a method of detecting a dielectric breakdown fault in an electric circuit having a high voltage battery including the steps of measuring a continuous voltage reading of the high voltage battery then sampling the continuous voltage reading of the high voltage battery at a fixed time interval. The method includes the step of calculating a change in the continuous voltage reading of the high voltage battery over the fixed time interval and repeatedly calculating an optimum fixed time interval and an optimum change in voltage over time. The optimum fixed time interval and optimum change in voltage over time are stored and then repeatedly compared to the constant voltage of the high voltage battery to calculate the resistance of the dielectric breakdown fault. The method includes the step of calculating the resistance of the dielectric breakdown fault independent of the capacitance of the electric circuit. The method includes the step of adjusting the optimum fixed time interval to reduce the time to compare the optimum change in voltage over time to the constant voltage of the high voltage battery thereby reducing the time to calculate the resistance of the dielectric breakdown fault.

BRIEF DESCRIPTION OF THE DRAWINGS

The details, advantages, structure, operation and various additional features of the present invention will appear more fully upon consideration of the illustrative embodiments now to be described in detail in connection with accompanying drawings where like reference numerals identify like elements throughout the drawings.

DETAILED DESCRIPTION OF THE INVENTION

Figure 2:
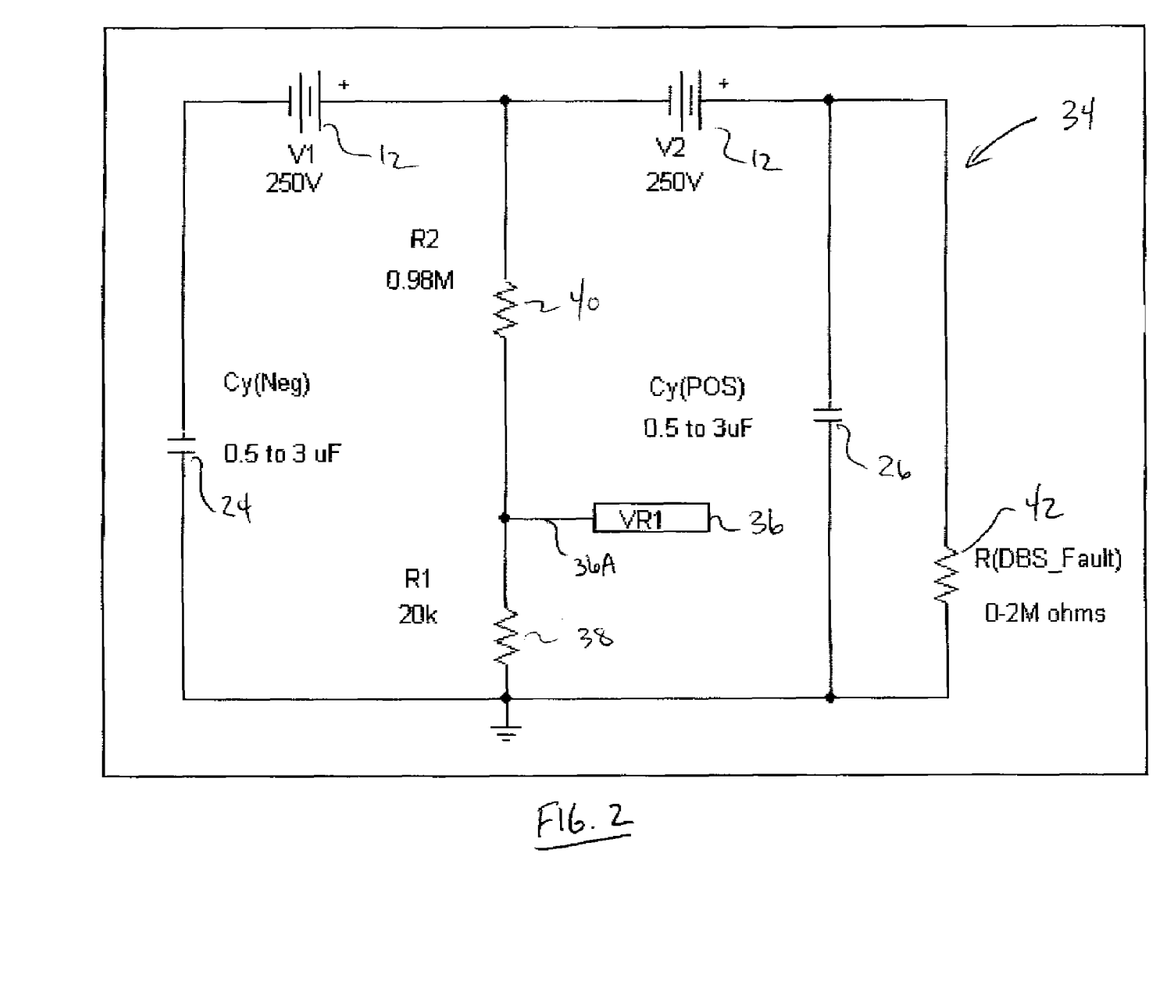
FIG. 2 shows a schematic illustration of a ground fault detection system according to an aspect of the present invention.

FIG. 2 shows a ground fault detection system 34 according to an aspect of the invention. Detection circuit VR1 36 continuously reads the voltage across a resistor network including R1 38 and R2 40 for sensing an AC signal indicative of an unintended electric path such as a short circuit or very low impedance connection between a battery 12 with V1 and V2. This short circuit or low impedance path is shown as the dielectric breakdown fault R(DBS_Fault) 42. Capacitance in the range of 0.5 to 10 microfarads is inherently included in such circuits and is shown as capacitors Cy(Neg) 24 and Cy(POS) 26.

Figure 3:
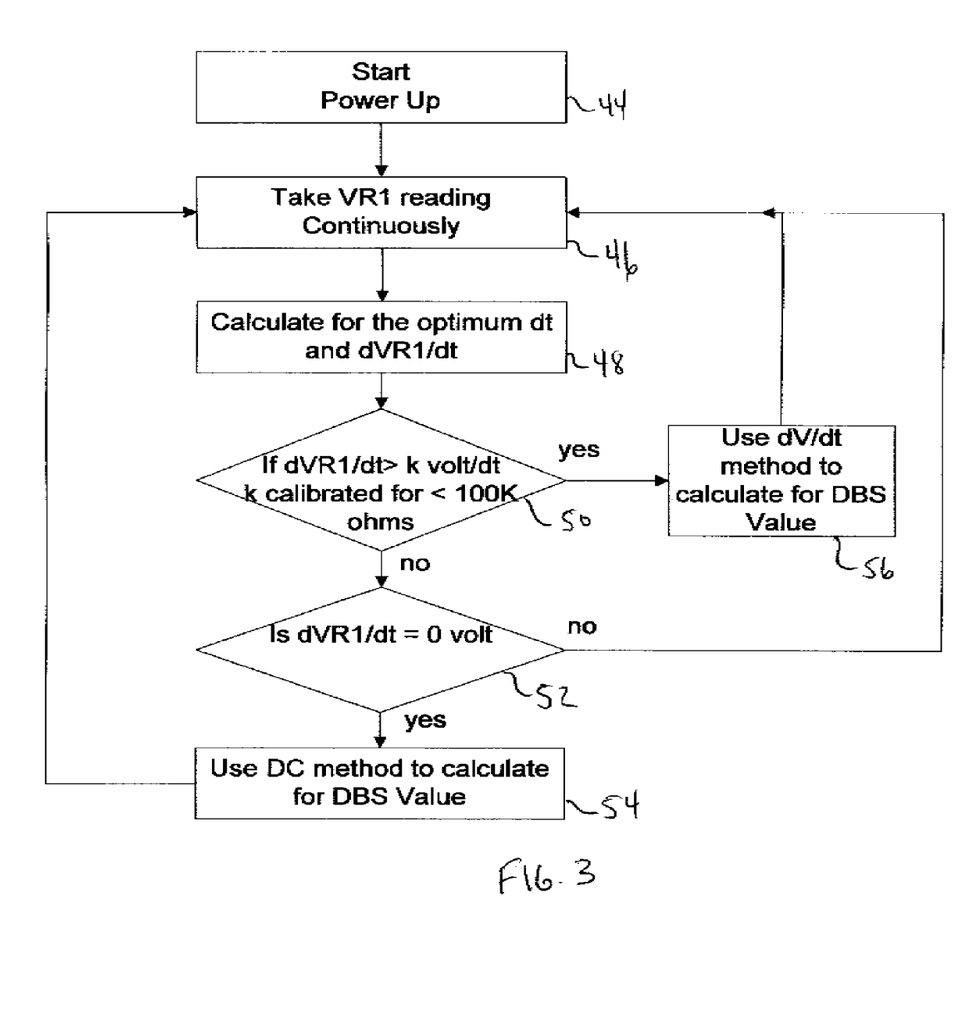
FIG. 3 is a flow chart which illustrates the steps according to an aspect of the present invention.

FIG. 3 illustrates the steps necessary to accurately and timely measure the dielectric breakdown resistance. Specifically, at power up (block 44) voltage VR1 36A is taken continuously as indicated in block 46. In this preferred embodiment, the chosen stepping time of the detection circuit (dt step) is 10 milliseconds, but it should be understood that this initial stepping time will be chosen by the circuit parameters and component values and will change based on the application. The change in the voltage (dVR1) over the change in time (dt) is continuously calculated by the circuitry of the present invention such that the 3 required points are calculated and stored by the circuitry. In addition, at block 48, the circuitry repeatedly adjusts for and estimates the optimum time interval for detection and measurement. As indicated in block 50 the circuit is initially calibrated based on 100 k ohms as indicated in FIG. 1 resistors R1 38 and R2 40. If the circuit is in steady state mode where dVR1/dt equals 0 volts (block 52), then the circuit dielectric breakdown voltage is calculated at block 54 using the steady state DC method as shown in equation 2 in FIG. 7A. If a steady state has not been achieved, then the dielectric breakdown resistance is detected and measured using the change in voltage over the change in time method as shown in block 56 of FIG. 3. As can be seen, the detection and measurement of the resistance of the dielectric breakdown fault is carried out independent of any capacitance that may be present in the electric circuit.

Figure 4:
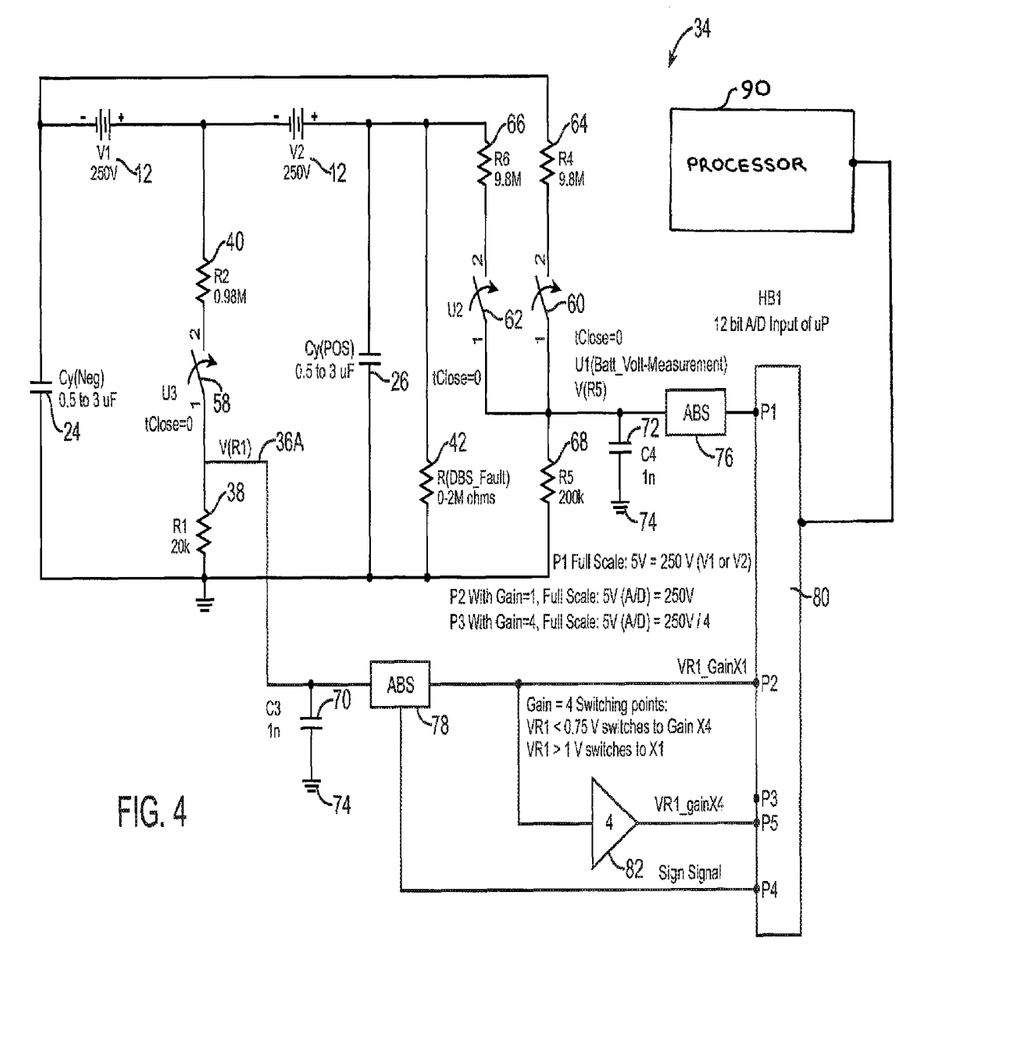
FIG. 4 shows another schematic illustration of a ground fault detection system according to yet another aspect of the present invention.

FIG. 4 shows a detailed schematic drawing of an embodiment of the ground fault detection system 34 of the present invention. As in FIG. 2 the circuit includes R1 38 and R2 40 for sensing the signal indicative of an unintended short circuit or low impedance path R(DBS_Fault) 42 between battery 12 shown with V1 of 250V and V2 of 250V. Capacitance in the range of 0.5 to 10 microfarads is shown as capacitors Cy(Neg) 24 and Cy(POS) 26. Detection circuit VR1 36 continuously reads the voltage across a resistor network including R1 38 and R2 40 and includes a switch U3 58 which connects and enables measurement by detection circuit VR1 36. It is important to note that switch U3 58 can be eliminated and detection circuit VR1 36 can be continuously connected for measurement without significant power drain on the system.

Detection circuit VR1 36 also includes switches U1 60 and U2 62 for alternately sampling the voltage across the battery 12. Resistors 64, 66 and 68 set up the appropriate resistor networks upon the closing of switches U1 60 and U2 62 for measuring the voltage across resistor R(DBS_Fault) 42 and allowing the subsequent calculation of its value, the dielectric breakdown fault resistance R(DBS_Fault) 42. Capacitors C3 70 and C4 72 are common to the floating ground connection 74 of the detection circuit 34. The absolute values of the signals are used to properly calculate the voltages and are provided by voltage converters/inverters 76 and 78. It is understood that a variety of commercially available converters and inverters can be chosen to perform this inversion/conversion function.

A to D converter 80 accepts input of signals P1 and the appropriate signals of P2, P3, P4 and P5 for comparison and calculation of the dielectric breakdown fault resistance R(DBS_Fault) 42. A to D converter 80 will be chosen based on the necessary resolution determined by the component values of detection circuit 36. As illustrated in FIG. 4, A to D converter 80 is shown as a 12 bit device using the depicted values. However, it will be understood that A to D converter 80 is preferably chosen to be in the range of 8 to 14 bits. Depending on the application, an A to D converter of higher resolution as is necessary to increase the accuracy of the dielectric breakdown resistance calculation will be chosen. An amplifier 82 is provided to amplify the signal VR1 36A when the voltage of signal 36A is less than a threshold voltage, in this case shown as 0.75 volts.

Figure 5:
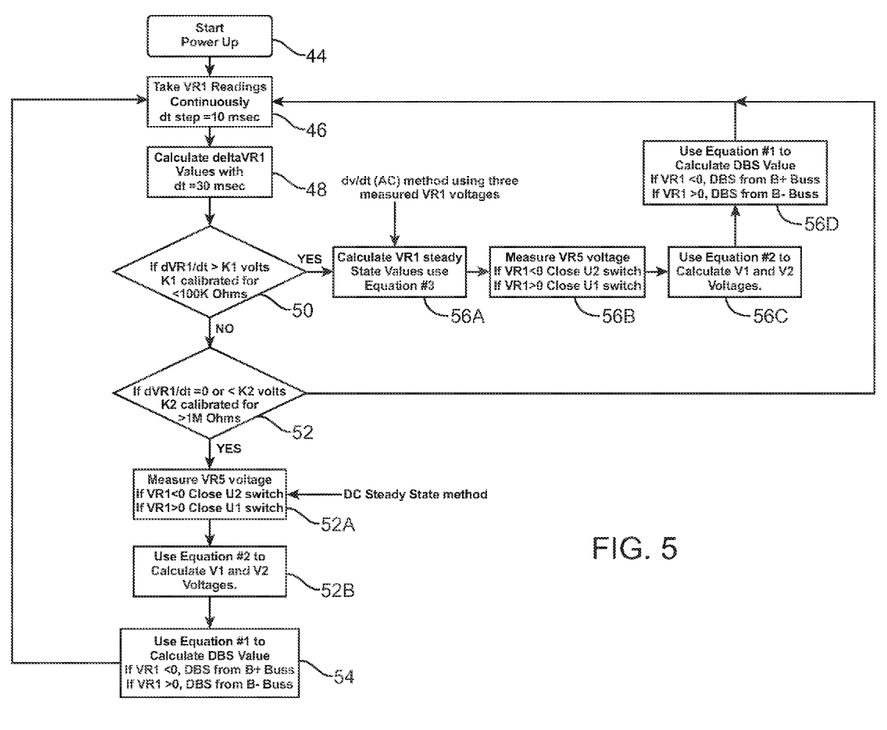
FIG. 5 is a flow chart which illustrates yet another set of steps according to an aspect of the present invention.

As shown in FIG. 5, the circuit begins detection at power up block 44 where voltage VR1 36A is taken continuously as indicated in block 46. The change in the voltage (dVR1) over the change in time (dt) is calculated by the circuitry of the present invention such that the circuitry repeatedly adjusts for and estimates the optimum time interval for detection as indicated in block 48. As indicated in block 50, the circuit is initially calibrated based on 100 k ohms as indicated by resistors R1 38 and R2 40 in FIG. 2. If the circuit is in steady state mode where dVR1/dt equals 0 volts (block 52), then the circuit dielectric breakdown voltage is calculated at block 54 using the steady state DC method as shown in equation 2 in FIG. 7A. If a steady state has not been achieved, then the dielectric breakdown resistance is detected and measured using the change in voltage over the change in time or slope method as illustrated in blocks 56A, 56B, 56C and 56D. These measurements are carried out using the combination of the AC equation and equation 1 in FIG. 7A and such measurements are independent of the capacitance of the circuit.

Figure 6:
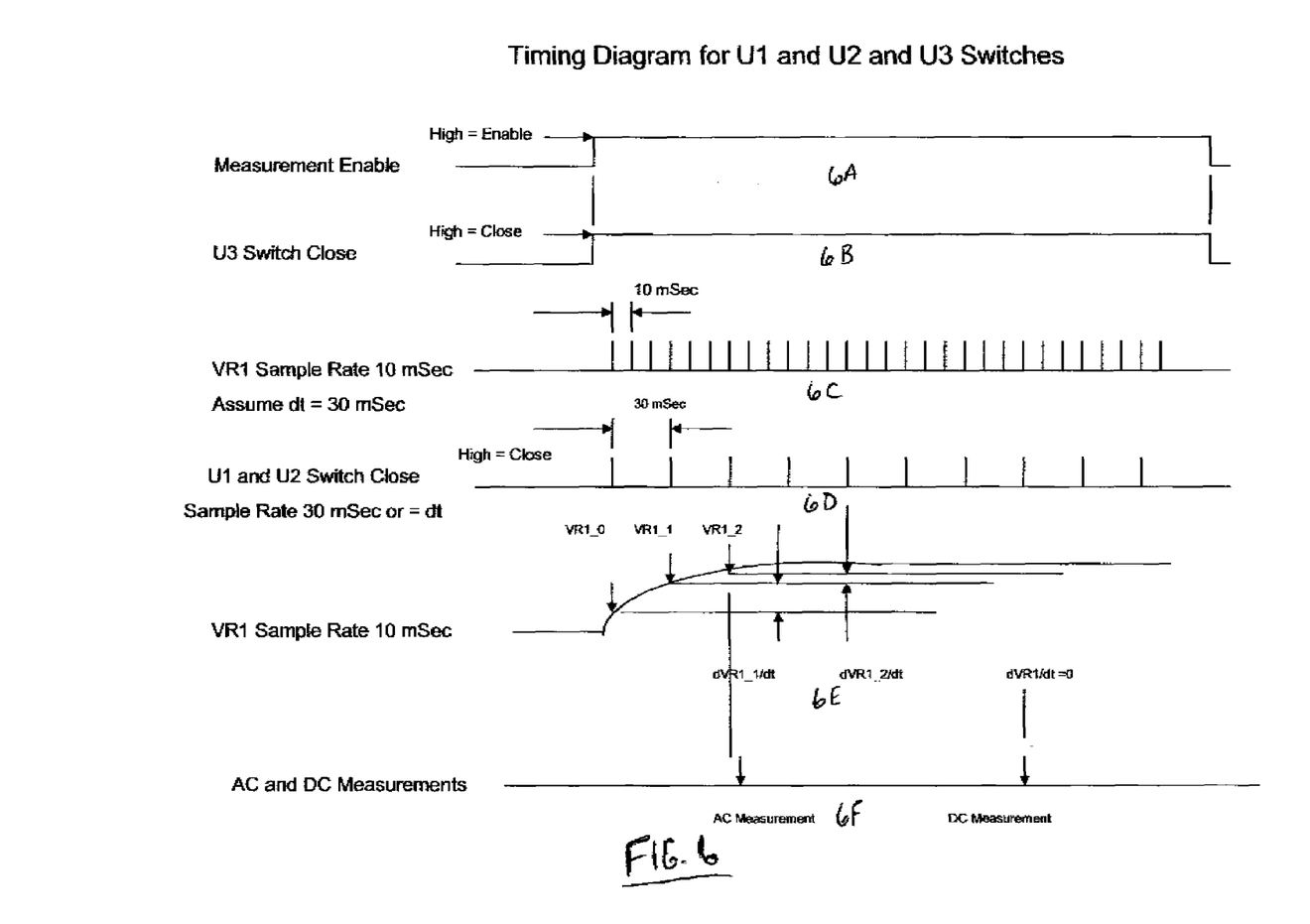
FIG. 6 illustrates a series of timing diagrams associated with the detection and measurement of a dielectric breakdown fault in a high voltage battery circuit.

FIG. 6 illustrates the timing of the operation of the detection circuit of FIG. 4. Measurement is enabled and switch U3 58 is closed at power up shown in block 44 of FIGS. 3 and 5 as shown in diagrams 6A and 6B. Voltage readings VR1, signal 36A are taken continuously at the illustrated VR1 sample rate of 10 milliseconds (diagram 6C). This sample rate will be chosen based on the circuit particulars and application. Switches U1 60 and U2 62 close at a chosen sampling rate (dt) interval of 30 milliseconds (diagram 6D) to measure voltages VR_0, VR_1 and VR_2 which determine the slope of the curve as shown in diagram 6E.

Figure 7A:
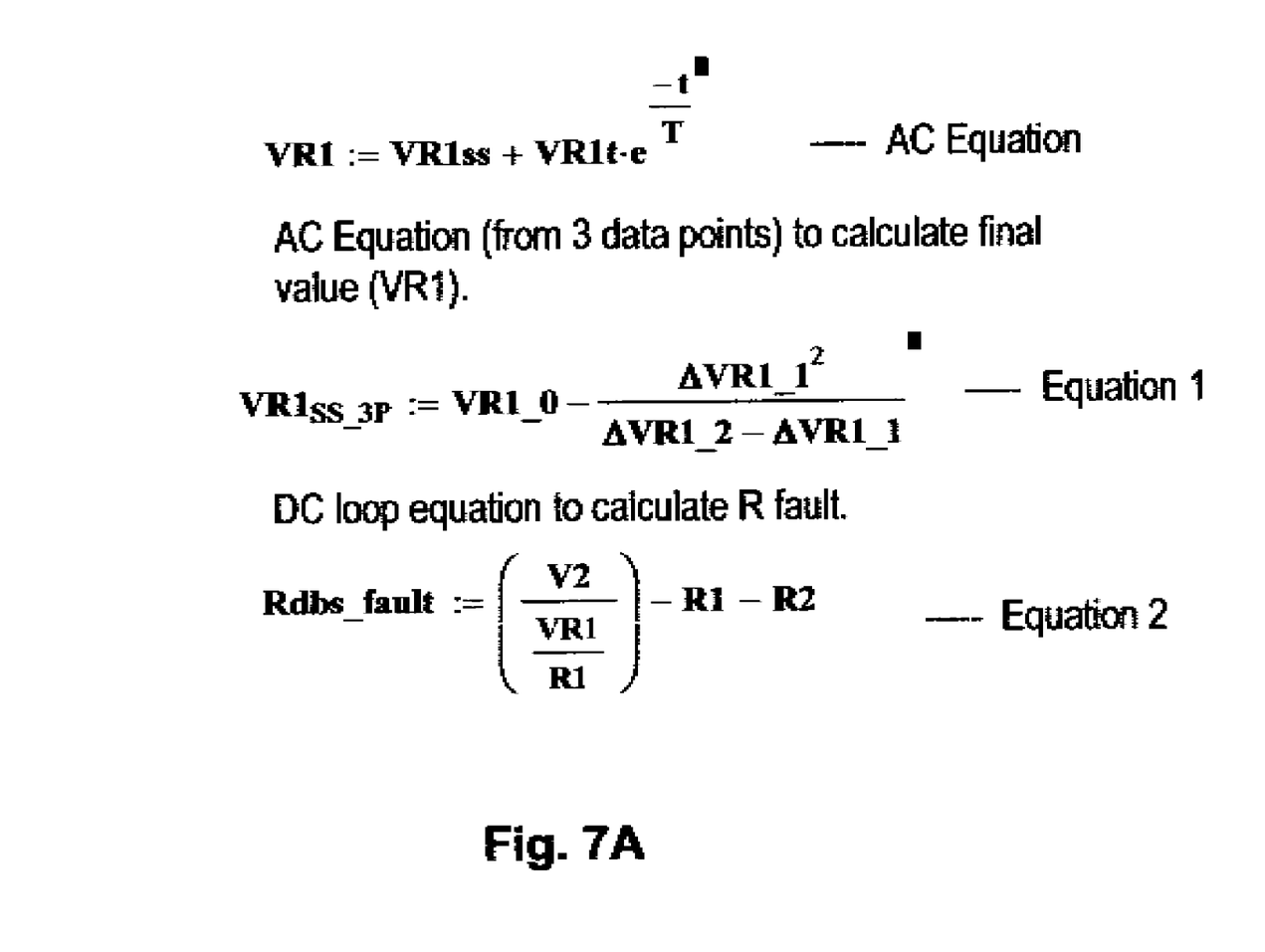
FIGS. 7A-7B show the calculations detailing the proposed method of detecting a dielectric breakdown fault of the present invention.

In operation as shown in FIG. 6, voltage measurements VR_0, VR_1 and VR_2 are used to determine the change in voltage over time (dVR1_1/dt and dVR1_2/dt) which provide the intervals necessary to calculate the dielectric breakdown resistance using equation 1 of FIG. 7 when the detection circuit 36 is not in a steady state mode. This is shown as the AC measurement step in diagram 6F. When the change in the voltages over time (dVR1_1/dt−dVR1_2/dt) approaches 0 (and accordingly the slope of the curve in diagram 6E approaches 0) the detection circuit is considered to be in a steady state. At this time during circuit operation, the voltages can be measured using a DC measurement (diagram 6E) allowing the dielectric breakdown resistance to be calculated using equation 2 of FIG. 7A. While these voltage readings may be a negative value, the circuit will use absolute values by converting the signals through voltage converters/inverters 76 and 78. As shown in FIG. 6, when a fault occurs, the change in voltages over time (dVR1_1/dt−dVR1_2/dt) begins to change (diagram 6E). At this point the sampling time (dt) is adjusted in an adaptive manner to a minimum of 10% of the change in the dVR1_1/dt−dVR1_2/dt reading compared to the previous reading. This adaptive adjustment will ensure that the data points will be on the expected curve (as shown in diagram 6E) with enough change in slope to accurately estimate the steady state voltage VR1 36A of the circuit.

Figure 7B:
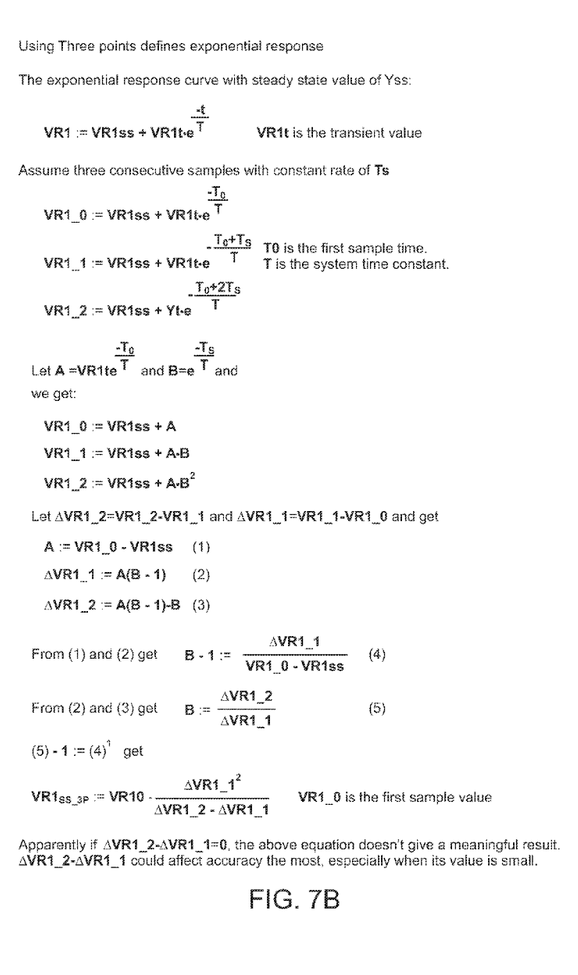

Referring to FIG. 7B, the exponential response using a steady state assumption (steady state value of VR1$ss$) and the transient value of VR1$t$ allows the derivation of the three point equation. This derivation is shown in FIG. 7B resulting in equation 1 of FIG. 7A. As previously described, one of the advantages of using the three point delta measurement for VR1 to calculate the R(DBS_Fault) 42 is that the capacitance is canceled out as shown in equation 1 of FIG. 7A. Therefore, the R(DBS_Fault) resistance 42 can be calculated independent of the capacitance of the dielectric breakdown detection circuit 34.

Figure 8A:
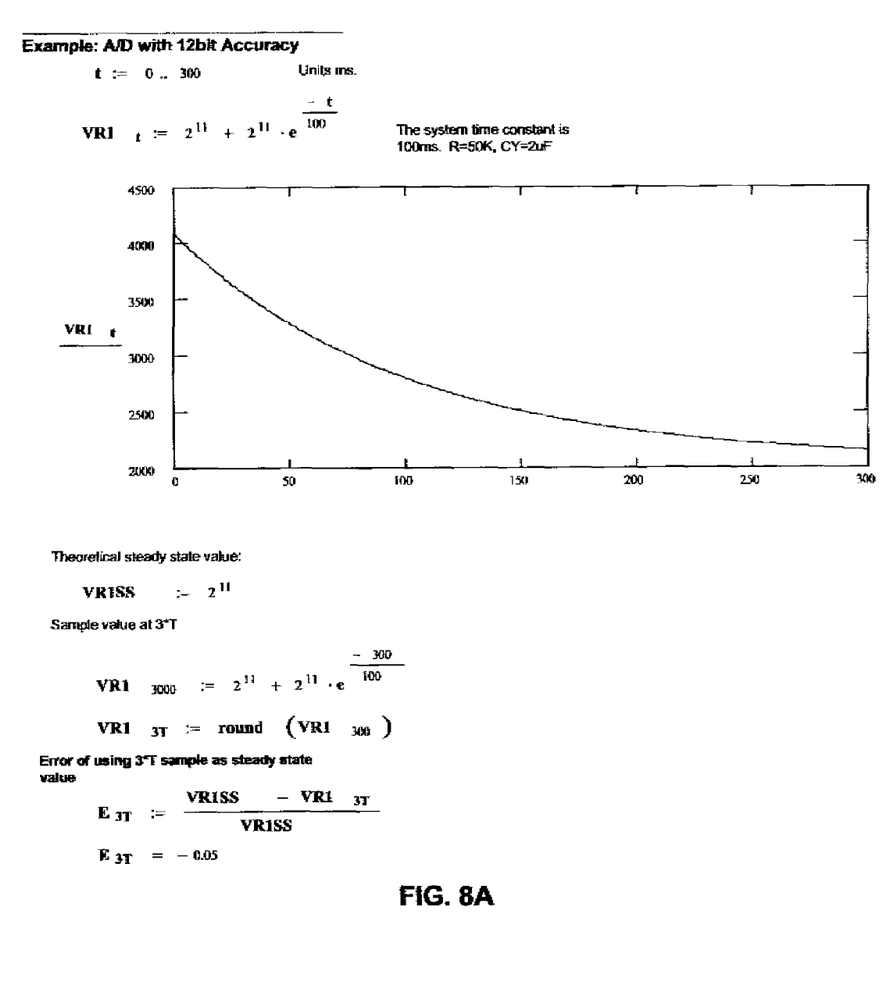
FIGS. 8A-8B show an example of the calculations carried out using the method of the present invention on a set of predetermined component values.
Figure 8B:
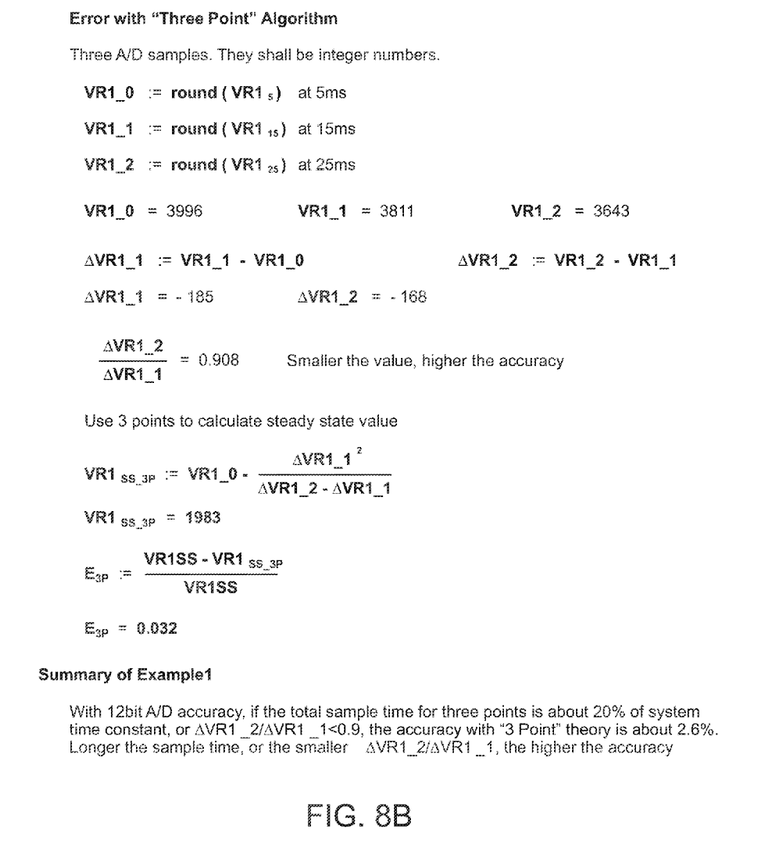

FIG. 8 shows an example wherein using the method of the present invention, the detection time can be reduced to 30% of the time constant achieved using the prior art detection method. Specifically, as shown in the FIG. 8 example, for a 50K R(DBS_Fault) 42, with the total capacitance of 2 uF, the time constant is 100 milliseconds. Using the steady state detection method of the prior art (FIG. 1), it will take 300 milliseconds for the steady state calculation. However measuring three (3) points of the curve and using the dV/dt slope method of the present invention, the R(DBS_Fault) 42 can be detected in a time period of 30 milliseconds. Once the fault is detected, it can be verified by the subsequent 3 point data with the dV/dt slope method until the R(DBS_Fault) 42 can be verified with steady state method when dV/dt=0. Using this dV/dt method, it is possible to report a potential fault within 100 milliseconds and continuously monitor the fault until it has reached a steady state value. As shown in the example (FIG. 8) and in equation 1 (FIG. 7A), longer dt time will provide better measurement accuracy.

Figure 9:
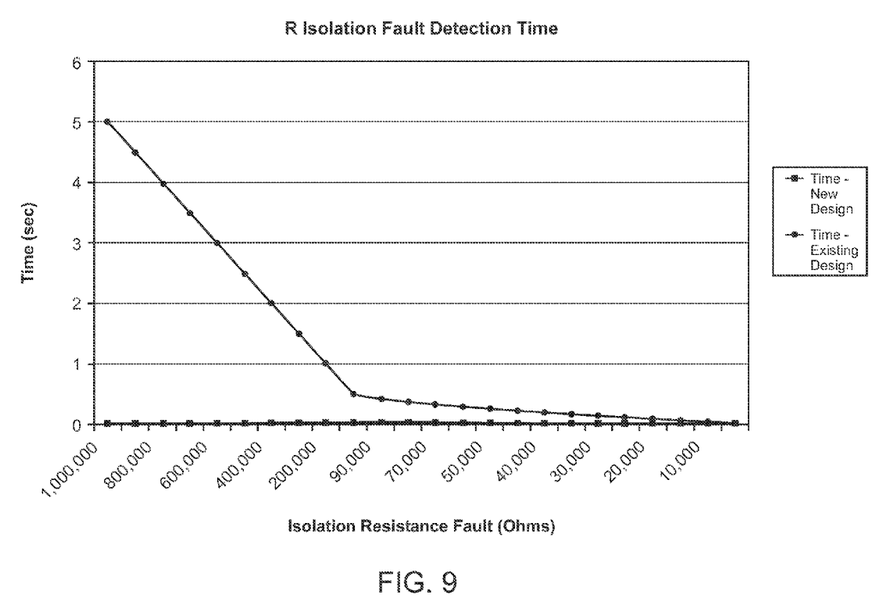
FIG. 9 shows a plot of the isolation resistance fault detection time of the prior art and the present invention.
Figure 10:
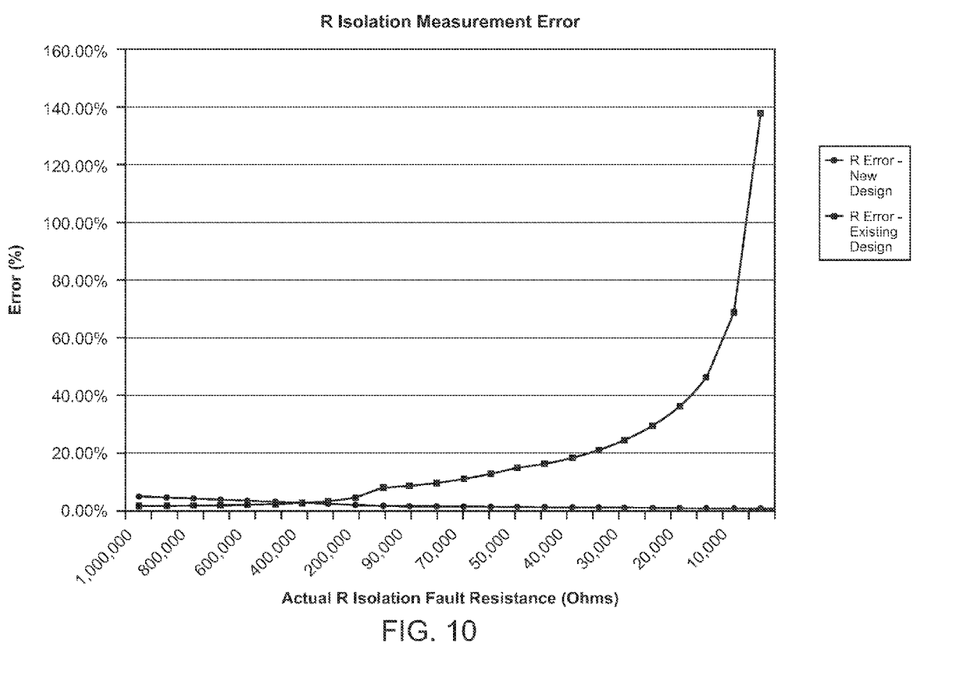
FIG. 10 shows a plot of the error of isolation resistance measurement of the prior art and the present invention.

The advantages of the detection method and circuit of the present invention, the results of the calculations shown in FIGS. 7a and 7B and the example of FIG. 8 are shown in FIGS. 9 and 10. In FIG. 9 the results of the detection time of equation 1 (FIG. 7A) are plotted versus the detection time of the prior art circuit of FIG. 1. This plot shows that the detection times of the circuit and method of the present invention are faster than those of the prior art circuit of FIG. 1 and significantly faster when isolation resistance (R(DBS_Fault) 42) is over 100,000 Ohms. As shown in FIG. 10, the error in measurement of R(DBS_Fault) 42 is considerably lower using the detection circuit and method of the present invention at isolation resistances R(DBS_Fault) 42 smaller than 100,000 Ohms.

It is to be understood that several of the steps disclosed in the flow charts of FIGS. 3 and 5, the specific logic of the circuits illustrated in FIGS. 2 and 4 or the details of the calculations of FIGS. 7A, 7B and 8, including but not limited to the adjustment of the circuit parameters or timing, could be performed by software programmed to carry out such steps. These steps could be performed, by way of example only, through software or a program storage device which may be part of a digital computer or computer network. In accordance with the present invention, the program or storage device may be implemented by a processor 90 (FIG. 4) within a computer that executes a series of computer-executable instructions. These instructions may reside, for example, in RAM, ROM or other storage media of the computer. Alternatively, the instructions may be contained on a data storage medium, such as a computer cd, DVD, ROM, RAM or diskette. Furthermore, the instructions may be stored on a DASD array, magnetic tape, conventional hard disk drive, electronic read-only memory, optical storage device, or other appropriate data storage device. In such an alternate embodiment, the computer-executable instructions may be lines of compiled executable code as available in any computer executable code, steps or language.

While the present invention has been described above in terms of specific embodiments, it is to be understood that the invention is not intended to be confined or limited to the preferred embodiments disclosed herein and that the scope of the present invention fully encompasses other embodiments which may become obvious to those skilled in the art. In addition, while specific component values have been show for ease of illustration and description, it should be understood that a variety of combination of values is possible and contemplated by the present invention. Further, while specific connections have been used and shown for ease of description, it should also be understood that a variety of connection points are possible and may vary depending on the specifics of the application and circuit used. These and all other such modifications and changes are considered to be within the scope of the appended claims and that the scope of the present invention is accordingly to be limited by nothing other than the appended claims.

We claim:

1. A detection circuit for detecting a dielectric breakdown fault in an electric circuit having a high voltage battery, the circuit comprising:
    means for continuously monitoring the voltage of the high voltage battery;
    means for taking a first voltage reading of the high voltage battery at a first fixed time interval;
    means for taking a second voltage reading of the high voltage battery at a second fixed time interval;
    means for calculating the change between the first and second voltage readings over a change in time;
    means for comparing the first and second voltage readings to the voltage of the high voltage battery and generating a first output signal;
    means for storing the first output signal;
    means for taking a third voltage reading of the high voltage battery at a third fixed time interval;
    means for calculating the change between the second and third voltage readings over the change in time;
    means for comparing the change between the second and third voltage readings to the voltage of the high voltage battery and generating a second output signal;
    means for storing the second output signal; and
    means for adjusting at least one of the first, second or third time interval to estimate the steady state voltage wherein said output signals are used to determine the resistance of the dielectric breakdown fault.

2. A circuit as in claim 1, including a capacitance wherein the resistance of the dielectric breakdown fault is determined independent of the capacitance.

3. A circuit as in claim 1, wherein the means for adjusting at least one of the first, second or third time interval provides a minimum of a 10 percent variation in the change in voltage over the change in time.

4. A circuit as in claim 1, wherein the circuit for detecting a dielectric breakdown fault is positioned at approximately a center of a positive terminal and a negative terminal of the high voltage battery.

5. A circuit as in claim 1, including a means for switching the circuit for detecting a dielectric breakdown fault across the high voltage battery.

6. A circuit as in claim 1, including means for measuring the steady state DC voltage and the resistance of dielectric breakdown fault when the change in voltage over time of the circuit equals 0.

7. A circuit as in claim 1, including means for measuring the steady state DC voltage and the resistance of dielectric breakdown fault when the change in voltage over time of the circuit is below a predetermined threshold voltage.

8. A circuit as in claim 1, including means for measuring the steady state DC voltage and the resistance of the dielectric breakdown fault when the slope of the curve of the change in voltage over time approaches 0.

9. A circuit as in claim 1, including means for determining if the value of the voltage reading of the high voltage battery is greater than or less than 0.

10. A circuit as in claim 1, including means for amplifying the signal which is representative of the value of the voltage reading of the high voltage battery when the signal is less than a threshold voltage.

11. A circuit as in claim 1, including a means for amplifying the signal which is representative of the value of the voltage reading of the high voltage battery when the signal is less than 1 volt.

12. A detection circuit for detecting a dielectric breakdown fault in an electric circuit having a high voltage battery, the circuit comprising:
means for taking a continuous voltage reading of the high voltage battery;
means for sampling the continuous voltage reading of the high voltage battery at a fixed time interval;
means for calculating a change in the continuous voltage reading of the high voltage battery over a change in time;
means for repeatedly calculating an optimum fixed time interval and an optimum change in voltage over time;
means for storing the optimum fixed time interval and optimum change in voltage over time;
means for repeatedly comparing the optimum change in voltage over the fixed time interval to the constant voltage of the high voltage battery to calculate a resistance of the dielectric breakdown fault;
means for adjusting the optimum fixed time interval to improve a speed of the comparison of the optimum change in voltage over time to the constant voltage of the high voltage battery to calculate the resistance of the dielectric breakdown fault.

13. A circuit as in claim 12, including capacitance wherein the resistance of the dielectric breakdown fault is calculated independent of the capacitance.

14. A circuit as in claim 12, wherein the means for adjusting the optimum fixed time interval provides a minimum of a 10 percent variation in the change of the voltage over the change in time.

15. A circuit as in claim 12, wherein the circuit for detecting a dielectric breakdown fault is positioned at approximately the center voltage tap between a positive terminal and a negative terminal of the high voltage battery.

16. A circuit as in claim 12, including a means for switching the circuit for detecting a dielectric breakdown fault into contact with the high voltage battery.

17. A circuit as in claim 12, including means for measuring the steady state DC voltage and the resistance of the dielectric breakdown fault when the change in voltage over time of the circuit equals 0.

18. A circuit as in claim 12, including means for measuring the steady state DC voltage and the resistance of the dielectric breakdown fault when the change in voltage over time of the circuit is below a predetermined threshold voltage.

19. A circuit as in claim 12, including means for measuring the steady state DC voltage and the resistance of dielectric breakdown fault when a slope of a curve of the change in voltage over time approaches 0.

20. A circuit as in claim 12, including means for determining if the value of the voltage reading of the high voltage battery is greater than or less than 0.

21. A circuit as in claim 12, including means for amplifying a signal which is representative of the value of the voltage reading of the high voltage battery when the signal is less than a threshold voltage.

22. A circuit as in claim 12, including a means for amplifying a signal which is representative of the value of the voltage reading of the high voltage battery when the signal is less than 0.75 volts.

23. A method of detecting a dielectric breakdown fault in an electric circuit having a high voltage battery, comprising the steps of:
measuring a continuous voltage reading of the high voltage battery;
sampling the continuous voltage reading of the high voltage battery at a fixed time interval;
calculating a change in the continuous voltage reading of the high voltage battery over the fixed time interval;
repeatedly calculating an optimum fixed time interval and an optimum change in voltage over time;
storing the optimum fixed time interval and optimum change in voltage over time;
repeatedly comparing the optimum change in voltage over the fixed time interval to the constant voltage of the high voltage battery to calculate the resistance of the dielectric breakdown fault; and
adjusting the optimum fixed time interval to reduce the time to compare the optimum change in voltage over time to the constant voltage of the high voltage battery thereby reducing the time to calculate the resistance of the dielectric breakdown fault.

24. The method of claim 23, wherein the electric circuit includes capacitance and wherein the step of repeatedly comparing the optimum change in voltage over the fixed time interval to the constant voltage of the high voltage battery to calculate the resistance of the dielectric breakdown fault is independent of the capacitance.

25. The method of claim 23, wherein the step of adjusting the optimum fixed time interval provides a minimum of a 10 percent variation in the change of the voltage over the change in time.

26. The method of claim 23, wherein the step of sampling the continuous voltage reading of the high voltage battery at the fixed time interval is sampled at approximately the center of a positive terminal and a negative terminal of the high voltage battery.

27. The method of claim 23, including the step of switching the circuit for detecting a dielectric breakdown fault across the high voltage battery.

28. The method of claim 23, including the step of measuring the steady state DC voltage and the resistance of dielectric breakdown fault when the change in voltage over time of the circuit equals 0.

29. The method of claim 23, including the step of measuring the steady state DC voltage and the resistance of dielectric breakdown fault when the change in voltage over time of the circuit is below a predetermined threshold voltage.

30. The method of claim 23, including the step of measuring the steady state DC voltage and the resistance of the dielectric breakdown fault when a slope of a curve of the change in voltage over time approaches 0.

31. The method of claim 23, including the step of determining if the value of the voltage reading of the high voltage battery is greater than or less than 0.

32. The method of claim 23, including the step of amplifying the signal which is representative of the value of the voltage reading of the high voltage battery when the signal is less than a threshold voltage.

33. The method of claim 23, including the step of amplifying the signal which is representative of the value of the voltage reading of the high voltage battery when the signal is less than 0.75 volts.

* * * * *